United States Patent [19]

Kusakabe et al.

[11] Patent Number: 5,721,145
[45] Date of Patent: Feb. 24, 1998

[54] METHOD OF MAKING A SEMICONDUCTOR SUBSTRATE HAVING GETTERING EFFECT

[75] Inventors: Kenji Kusakabe; Yoshiko Kokawa; Masahiro Sekine, all of Hyogo, Japan

[73] Assignee: Mitsubishi Denki Kabushiki Kaisha, Tokyo, Japan

[21] Appl. No.: 668,878

[22] Filed: Jun. 24, 1996

Related U.S. Application Data

[62] Division of Ser. No. 107,873, Aug. 18, 1993, abandoned.

[30] Foreign Application Priority Data

Sep. 21, 1992 [JP] Japan ................................ 4-251280

[51] Int. Cl.⁶ .......................................... H01L 21/306
[52] U.S. Cl. .................... 437/12; 437/233; 437/241; 437/DIG. 968; 437/DIG. 978
[58] Field of Search ................. 437/12, 11, 10, 437/233, 241, DIG. 968, DIG. 978, DIG. 979

[56] References Cited

U.S. PATENT DOCUMENTS

| | | |
|---|---|---|
| 4,053,335 | 10/1977 | Hu . |
| 4,525,239 | 6/1985 | Wang ................................ 437/10 |
| 4,561,171 | 12/1985 | Schlosser ......................... 437/12 |
| 4,621,414 | 11/1986 | Iranmanesh . |
| 4,631,804 | 12/1986 | Roy . |
| 4,766,086 | 8/1988 | Ohshima et al. ................ 437/10 |
| 5,130,260 | 7/1992 | Suga et al. ...................... 437/10 |
| 5,189,508 | 2/1993 | Tachimori et al. . |
| 5,194,395 | 3/1993 | Wada ............................... 437/10 |
| 5,327,007 | 7/1994 | Imura et al. . |
| 5,374,842 | 12/1994 | Kusakabe . |
| 5,444,001 | 8/1995 | Tokuyama ....................... 437/12 |
| 5,559,052 | 9/1996 | Lee et al. ......................... 437/978 |

FOREIGN PATENT DOCUMENTS 092540  10/1983  European Pat. Off. .

OTHER PUBLICATIONS

Hermann Franke, Lexikon der Physik, 1969, pp. 1088 & 1813 (with English Language Translation).
Dr. Happel, Niedershcrift über die Anhörung, pp. 2–4 (with English Language Translation).
Wolf et al., "Silicon Processing for the VLSI Era," vol. I, Lattice Press, 1986, pp. 191–195.

*Primary Examiner*—Charles L. Bowers, Jr.
*Assistant Examiner*—Lynne A. Gurley
*Attorney, Agent, or Firm*—Lowe, Price, LeBlanc & Becker

[57] ABSTRACT

The present invention is mainly characterized in that a semiconductor substrate improved so as to maintain a gettering effect for a long time can be obtained. A polycrystalline silicon film is formed on the rear surface of a semiconductor substrate. A silicon oxide film and silicon nitride film are formed over the rear surface of semiconductor substrate so as to cover polycrystalline silicon film.

3 Claims, 8 Drawing Sheets

METHOD OF MAKING A SEMICONDUCTOR SUBSTRATE HAVING GETTERING EFFECT

This application is a division of application Ser. No. 08/107,873 filed Aug. 18, 1993 now abandoned.

BACKGROUND OF THE INVENTION

1. Field of the Invention

The present invention relates generally to semiconductor substrates having a gettering effect, and particularly to a semiconductor substrate improved so as to maintain a gettering effect for a long time period. The present invention further relates to the method of manufacturing such a semiconductor substrate having a gettering effect.

2. Description of the Background Art

In a semiconductor device where unintentional contamination of impurities is quite undesirable, gettering technique for improving characteristics of the device is important. Gettering means removal of heavy metal, such as Cu, Fe and Au, from an electrically activated region of the semiconductor device.

FIG. 10 is a cross sectional view of a conventional semiconductor substrate having a gettering effect. The cross sectional view shown in FIG. 10 is taken along the line A—A in FIG. 11 showing the semiconductor substrate in a perspective view. Referring to FIG. 10, a polycrystalline silicon film 2 is provided to cover the sidewall and the rear surface of a silicon single crystal wafer 1. Heavy metal impurities 3 attached on silicon single crystal wafer 1 are gettered with polycrystalline silicon film 2 with reference to FIG. 12, so that the surface of silicon single crystal wafer 1 can be kept clean.

FIG. 13 shows cross sectional views of a semiconductor substrate in respective steps in sequence of a manufacturing method of the conventional semiconductor substrate having a gettering effect.

Referring to FIG. 13(a), silicon single crystal wafer 1 having both surfaces subjected to chemical etching is prepared. The silicon single crystal wafer is etched using hydrogen fluoride, nitric acid or acetic acid, for example.

Referring to FIG. 13(b), polycrystalline silicon film 2 is deposited on the whole surface of silicon single crystal wafer 1 by means of chemical vapor deposition.

Referring to FIG. 13(c), only one side of silicon single crystal wafer 1 is subjected to mirror polish.

In the conventional semiconductor substrate having a gettering effect thus structured, since polycrystalline silicon film 2 is exposed as in FIG. 10, polycrystalline silicon constituting polycrystalline silicon film 2 is oxidized to be $SiO_2$ during the manufacturing process of the semiconductor device, resulting in no polycrystalline silicon film.

SUMMARY OF THE INVENTION

One object of the present invention is to provide a semiconductor substrate having a gettering effect improved so as to prevent polycrystalline silicon from being used up during a manufacturing process of a semiconductor device.

Another object of the present invention is to provide a method of manufacturing such a semiconductor substrate having a gettering effect.

In order to accomplish the aforementioned purposes, a semiconductor substrate having a gettering effect in accordance with a first aspect of the present invention includes a semiconductor substrate having a front surface and a rear surface. A polycrystalline silicon film is formed on the rear surface of the semiconductor substrate. A silicon nitride film is formed over the rear surface of the semiconductor substrate to cover the polycrystalline silicon film.

A semiconductor substrate having a gettering effect in accordance with a second aspect of the present invention includes a semiconductor substrate having a front surface and a rear surface. A polycrystalline silicon film is formed on the rear surface of the semiconductor substrate. A silicon oxide film is formed over the rear surface of the semiconductor substrate to cover the polycrystalline silicon film. A silicon nitride film is formed over the semiconductor substrate to cover the silicon oxide film.

In a method of manufacturing a semiconductor substrate having a gettering effect in accordance with a third aspect of the present invention, a semiconductor substrate having a front surface and a rear surface is initially prepared. A polycrystalline silicon film is formed on the rear surface of the semiconductor substrate. A silicon nitride film is formed over the rear surface of the semiconductor substrate to cover the polycrystalline silicon film.

In a method of manufacturing a semiconductor substrate having a gettering effect in accordance with a fourth aspect of the present invention, a semiconductor substrate having a front surface and a rear surface is initially prepared. A polycrystalline silicon film is formed on the rear surface of the semiconductor substrate. A silicon oxide film is formed on the polycrystalline silicon film. A silicon nitride film is formed on the silicon oxide film.

In the semiconductor substrate having a gettering effect according to the first aspect of the present invention, the silicon nitride film which serves as an oxygen transmission preventing layer is formed over the rear surface of the semiconductor substrate to cover the polycrystalline silicon film, whereby the polycrystalline silicon film does not contact with oxygen.

In the semiconductor substrate having a gettering effect according to the second aspect of the present invention, the silicon oxide film is formed between the polycrystalline silicon film and the silicon nitride film. The thermal expansion coefficient of the silicon oxide film is between those of the silicon nitride film and the polycrystalline silicon film. Accordingly, the silicon oxide film serves as a buffering film, preventing the silicon nitride film from peeling off the polycrystalline silicon film due to the difference of their thermal expansion coefficients.

In the method of manufacturing a semiconductor substrate having a gettering effect according to the third aspect of the present invention, the silicon nitride film preventing transmission of oxygen is formed over the rear surface of the semiconductor substrate to cover the polycrystalline silicon film, whereby the semiconductor substrate in which the polycrystalline silicon film prevented from being in contact with oxygen can be obtained.

In the method of manufacturing a semiconductor substrate having a gettering effect according to the fourth aspect of the present invention, the silicon oxide film is formed between the polycrystalline silicon film and the silicon nitride film. The thermal expansion coefficient of the silicon oxide film is between those of the silicon nitride film and the polycrystalline silicon film. Accordingly, the silicon oxide film serves as a buffering film, preventing the silicon nitride film from peeling off the polycrystalline silicon film due to the difference of their thermal expansion coefficients. Consequently, the Semiconductor substrate having a gettering effect, in which the silicon nitride film is prevented from peeling off the substrate, can be obtained.

DESCRIPTION OF THE PREFERRED EMBODIMENTS

Embodiments of the present invention will hereinafter be described with reference to the drawings.

Embodiment 1

Figure 1:
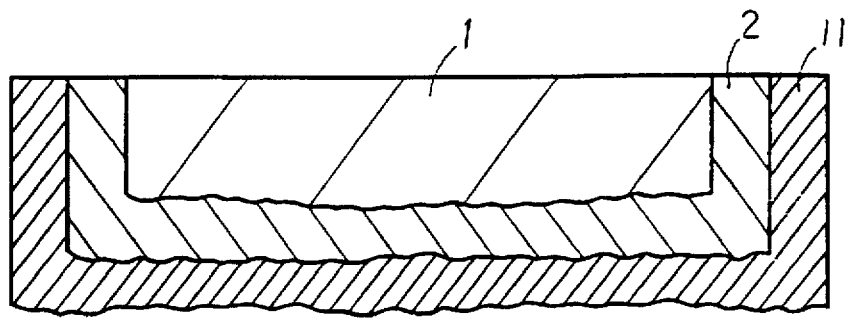
FIG. 1 is a cross sectional view of a semiconductor substrate having a gettering effect in accordance with one embodiment of the present invention.

FIG. 1 is a cross sectional view of a semiconductor substrate having a gettering effect in accordance with one embodiment of the present invention. A polycrystalline silicon film 2 is formed to cover the sidewall and the rear surface of a silicon single crystal wafer 1. A film thickness of polycrystalline silicon film 2 is not less than 0.2 μm. The whole surface of polycrystalline silicon film 2 is covered with a silicon nitride film 11. Silicon nitride film 11 is so close that an oxygen molecule can not be transmitted. Therefore, polycrystalline silicon film 2 does not contact with oxygen in the manufacturing process of the semiconductor device. Consequently, exhaustion of the polycrystalline silicon having a function of gettering heavy metal impurities can be prevented. The following is the reason for the film thickness of polycrystalline silicon film 2 being required to be not less than 0.2 μm.

Figure 2:
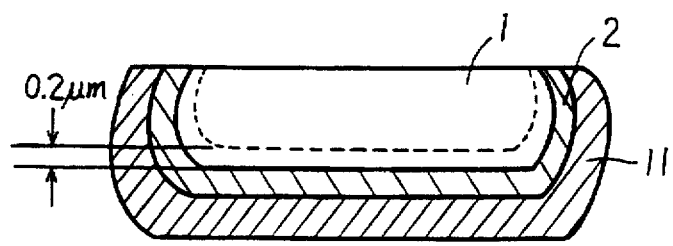
FIG. 2 is a cross sectional view of a semiconductor substrate showing that a film thickness of not less than 0.2 μm is required for the polycrystalline silicon film.

Referring to FIG. 2, in a heat treatment process for manufacturing the semiconductor device, polycrystalline silicon grows in a solid phase epitaxial manner on the rear surface of silicon single crystal wafer 1. As a result of the solid phase epitaxial growth of polycrystalline silicon, polycrystalline silicon film 2 is consumed by approximately 0.2 μm. Therefore, in order to maintain a gettering effect during the manufacturing process of the semiconductor device, the thickness of not less than 0.2 μm is required for polycrystalline silicon film 2.

Embodiment 2

Figure 3:
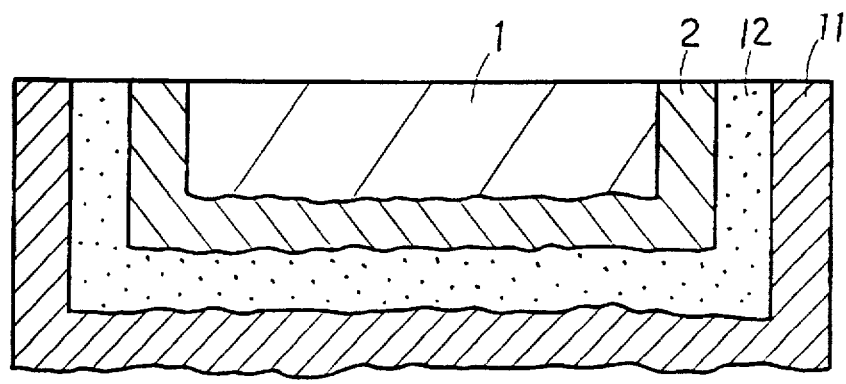
FIG. 3 is a cross sectional view of a semiconductor substrate having a gettering effect in accordance with another embodiment of the present invention.

FIG. 3 is a cross sectional view of a semiconductor substrate having a gettering effect in accordance with another embodiment of the present invention. Referring to FIG. 3, a polycrystalline silicon film 2 is formed on the sidewall and the rear surface of a silicon single crystal wafer 1. The surface of polycrystalline silicon film 2 is covered with a silicon oxide film 12. A silicon nitride film 11 covers silicon oxide film 12. Also in this embodiment, the film thickness of polycrystalline silicon film 2 is not less than 0.2 μm. The thermal expansion coefficient of silicon oxide film 12 is between those of polycrystalline silicon film 2 and silicon nitride film 11. Silicon oxide film 12 serves as a buffering film, preventing silicon nitride film 11 from peeling off polycrystalline silicon film 2 due to the difference of their thermal expansion coefficients. The film thickness of silicon oxide film 12 is approximately 100 Å, and that of silicon nitride film 11 is approximately 300 Å.

Embodiment 3

This embodiment relates to a method of manufacturing the semiconductor substrate having a gettering effect shown in FIG. 1.

Referring to FIG. 1, silicon single crystal wafer 1 having a front surface and a rear surface is prepared. Polycrystalline silicon film 2 is formed on the side and the bottom surface of silicon single crystal wafer 1. Silicon nitride film 11 is formed on the whole surface of polycrystalline silicon film 2 by means of plasma vapor deposition with $SiH_4+NH_3$ gas.

Embodiment 4

This embodiment relates to another method of manufacturing the semiconductor substrate shown in FIG. 1. Polycrystalline silicon film 2 is formed on the sidewall and the rear surface of silicon single crystal wafer 1. The surface of polycrystalline silicon film 2 is made in contact with nitrogen gas at the temperature not less than 1200° C., so as to be nitried, whereby silicon nitride film 11 is formed.

Embodiment 5

This embodiment relates to a further method of manufacturing the semiconductor substrate having a gettering effect shown in FIG. 1. Referring to FIG. 1, polycrystalline silicon film 2 is formed on the sidewall and the rear surface of silicon single crystal wafer 1. Nitrogen ions are implanted in the whole surface of polycrystalline silicon film 2 to form silicon nitride film 11 on the whole surface of polycrystalline silicon film 2. Nitrogen ions are implanted by at least $7 \times 10^{22}$ atoms/cm$^2$. According to this method, silicon nitride film 11 having nitrogen atoms uniformly distributed can be obtained.

Embodiment 3-1

This embodiment relates to a method of manufacturing the semiconductor substrate having a gettering effect shown in FIG. 3. Referring to FIG. 3, polycrystalline silicon film 2 is formed on the sidewall and the rear surface of silicon single crystal wafer 1. Silicon oxide film 12 is formed on the whole surface of polycrystalline silicon film 2. Silicon nitride film 11 is formed on the whole surface of silicon oxide film 12 by means of chemical vapor deposition with $SiH_4 + NH_3$ gas.

Embodiment 4-1

This embodiment relates to another method of manufacturing the semiconductor substrate having a gettering effect shown in FIG. 3. Polycrystalline silicon film 2 is formed on the sidewall and the rear surface of silicon single crystal wafer 1. Silicon oxide film 12 is formed on the whole surface of polycrystalline silicon film 2. The surface of the silicon oxide film is reduced with hydrogen. The portion reduced with hydrogen is made in contact with nitrogen gas at the temperature not less than 1200° C., so that silicon nitride film 11 is formed on the whole surface of silicon oxide film 12.

Embodiment 5-1

This embodiment relates to a further method of manufacturing the semiconductor substrate having a gettering effect shown in FIG. 3. Polycrystalline silicon film 2 is formed on the sidewall and the rear surface of silicon single crystal wafer 1. Silicon oxide film 12 is formed on the whole surface of polycrystalline silicon film 2. The surface of silicon oxide film 12 is reduced with hydrogen gas. Nitrogen ions are implanted in the portion reduced with hydrogen gas, so that silicon nitride film 11 is formed on the whole surface of silicon oxide film 12.

Embodiment 6

This embodiment relates to still further method of manufacturing the semiconductor substrate having a gettering effect shown in FIG. 3. Polycrystalline silicon film 2 is formed on the sidewall and the rear surface of silicon single crystal wafer 1. The surface of polycrystalline silicon film 2 is thermally oxidized, so that silicon oxide film 12 is formed on the whole surface of polycrystalline silicon film 2. Silicon nitride film 11 is formed on the whole surface of silicon oxide film 12.

Embodiment 7

This embodiment relates to still further method of manufacturing the semiconductor substrate having a gettering effect shown in FIG. 3. Polycrystalline silicon film 2 is formed on the sidewall and the rear surface of silicon single crystal wafer 1. Silicon oxide film 12 is formed on the whole surface of polycrystalline silicon film 2 by means of chemical vapor deposition using $SiH_4 + O_2$ gas. Silicon nitride film 11 is formed on the whole surface of silicon oxide film 12 by means of chemical vapor deposition with $SiH_4 + NH_3$ gas. According to this embodiment, silicon oxide film 12 and silicon nitride film 11 can be successively formed by simply changing of the gases. Moreover, the process is allowed to be performed at a low temperature, preventing crystal defects or contamination.

Embodiment 8

This embodiment relates to still further method of manufacturing the semiconductor substrate having gettering effect shown in FIG. 3. Polycrystalline silicon film 2 is formed on the sidewall and the rear surface of silicon single crystal wafer 1. Silicon oxide film 12 is formed on polycrystalline silicon film 2 by a suitable method. The surface of silicon oxide film 12 is reduced with hydrogen gas. Thereafter, the reduced portion is made into contact with $N_2$ gas at a temperature not less than 1200° C., so that silicon nitride film 11 is formed.

Embodiment 9

This embodiment relates to still further method of manufacturing the semiconductor substrate having a gettering effect shown in FIG. 3. Polycrystalline silicon film 2 is formed on the sidewall and the rear surface of silicon single crystal wafer 1. Oxygen ions are implanted in the whole surface of polycrystalline silicon film 2 to form silicon oxide film 12 on the whole surface of polycrystalline silicon film 2. Thereafter, silicon nitride film 11 is formed on the whole surface of silicon oxide film 12 by a suitable method.

Embodiment 10

This embodiment relates to still further method of manufacturing the semiconductor substrate having a gettering effect shown in FIG. 3.

Figure 4:
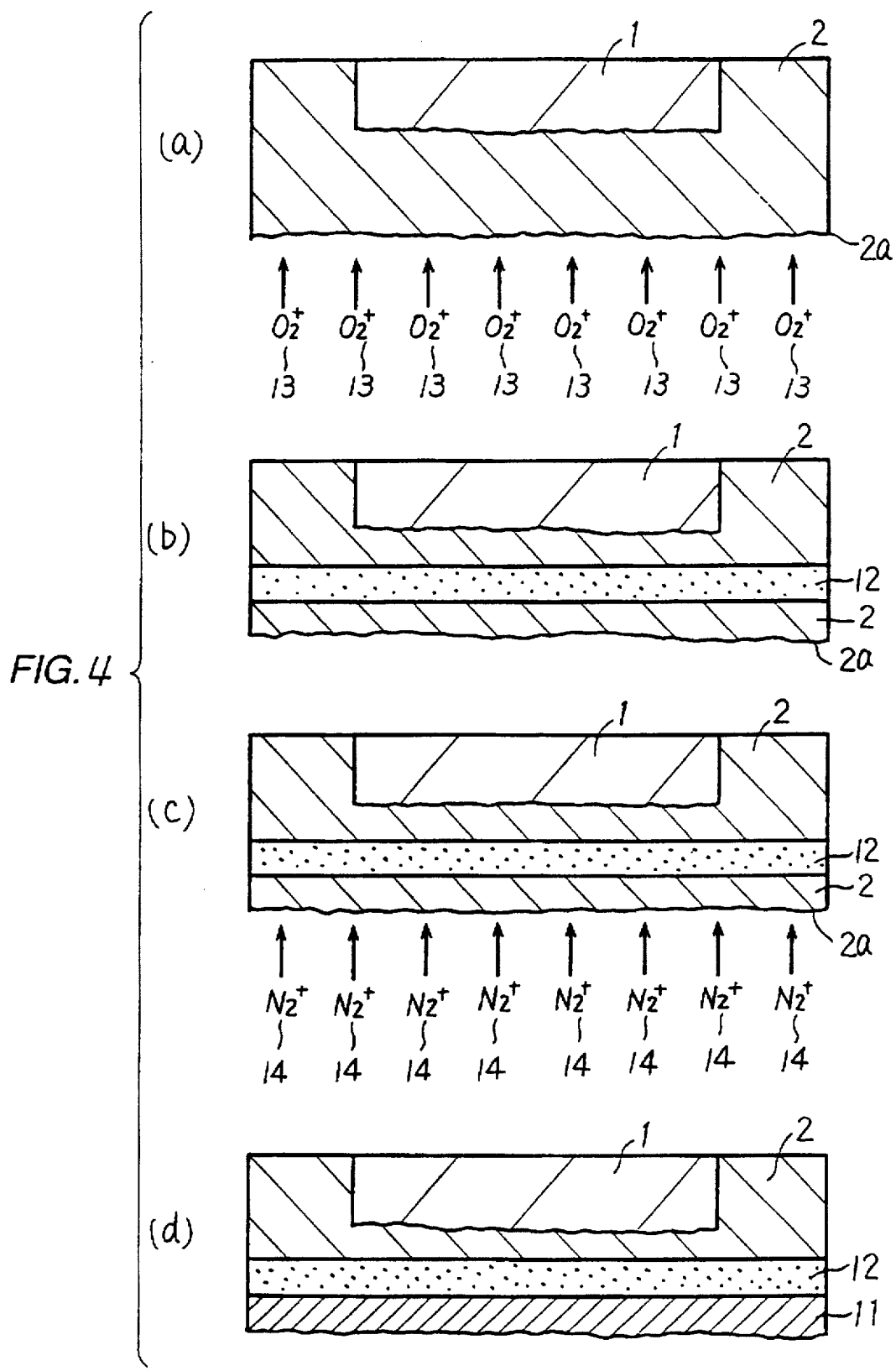
FIG. 4 shows cross sectional views of a semiconductor substrate in respective steps in sequence of a method of manufacturing the semiconductor substrate having a gettering effect in accordance with one embodiment of the present invention.

Referring to FIG. 4(a), polycrystalline silicon film 2 is formed on the sidewall and the rear surface of silicon single crystal wafer 1.

Referring to FIGS. 4(a) and (b), oxygen ions 13 are implanted in a surface 2a of polycrystalline silicon film 2 with such energy that oxygen ions 13 remain in an interlayer portion of polycrystalline silicon film 2, forming silicon oxide film 12 at the interlayer portion of polycrystalline silicon film 2.

Referring to FIGS. 4(c) and (d), nitrogen ions 14 are implanted in the surface of polycrystalline silicon film 2, forming silicon nitride film 11 on the surface of polycrystalline silicon film 2. According to this embodiment, the process can be effectively simplified.

Embodiment 11

Figure 5:
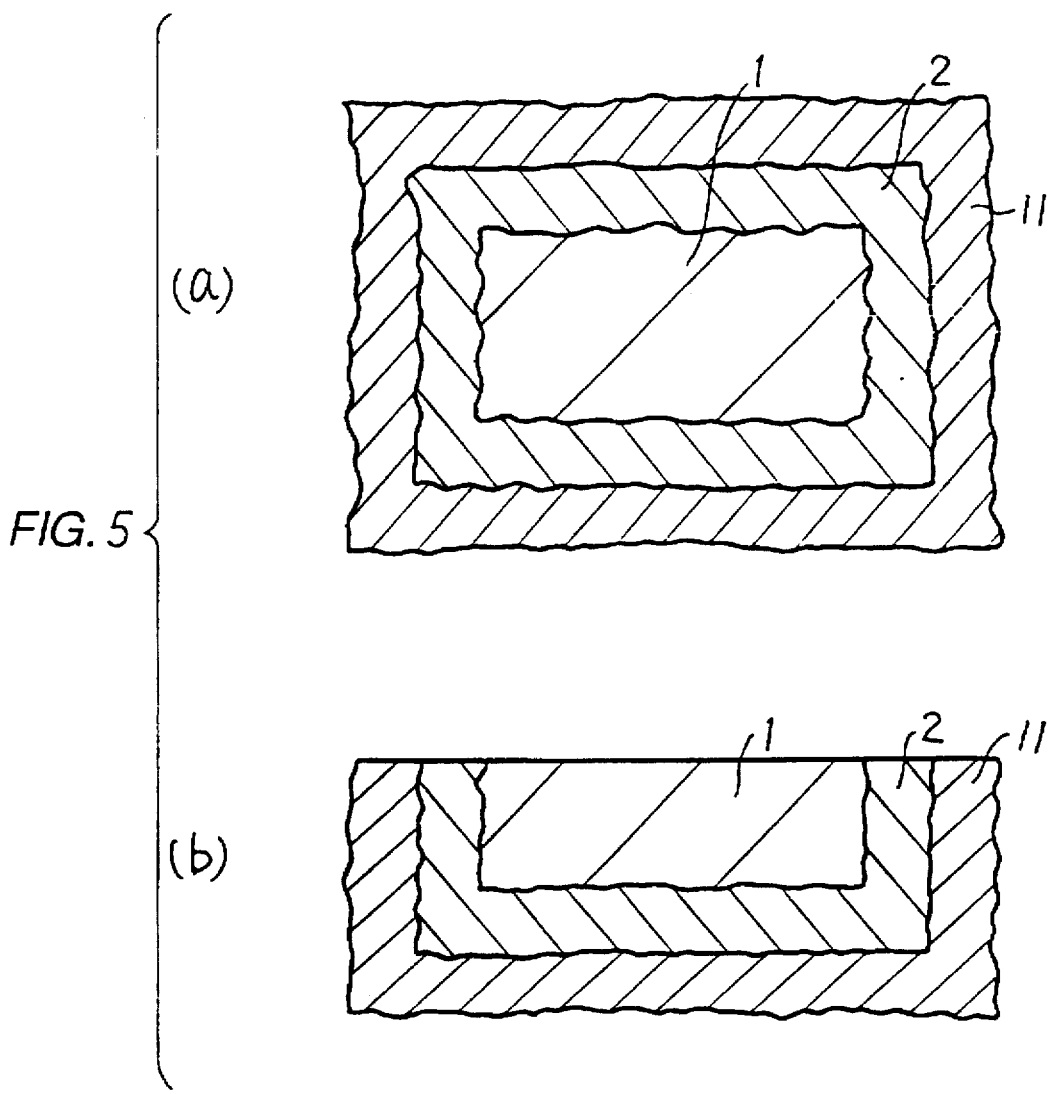
FIG. 5 shows cross sectional views of the semiconductor substrate in respective steps in sequence of a method of manufacturing the semiconductor substrate having a gettering effect shown in FIG. 1.

This embodiment relates to still further method of manufacturing the semiconductor substrate having a gettering effect shown in FIG. 1. Referring to FIG. 5(a), polycrystalline silicon film 2 and silicon nitride film 11 are formed on the whole surface of silicon single crystal wafer 1 having its surface etched, by a suitable method.

Referring to FIG. 5(b), mirror polish is performed so that the surface of silicon single crystal wafer 1 appears, whereby the semiconductor substrate having a gettering effect shown in FIG. 1 can be obtained.

Figure 6:
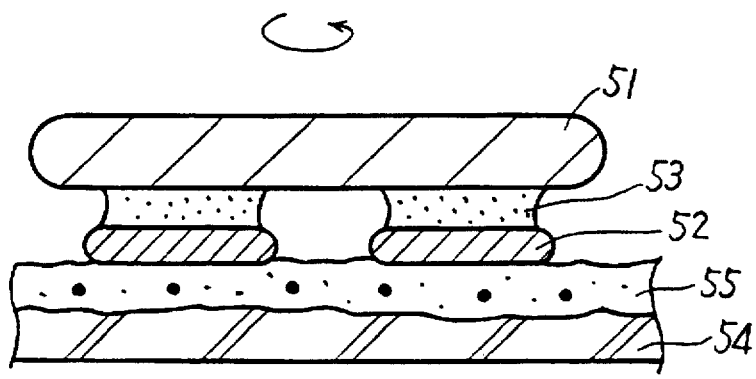
FIG. 6 is a schematic diagram showing a method of mirror polish of a silicon single crystal wafer.

FIG. 6 shows a method of mirror polish. An etched wafer 52 is fit to a ceramic plate 51 with wax 53. Etched wafer 52 is placed on a slurry 55 (colloidal silica+alkali+water) on an abrasive cloth 54. Ceramic plate 51 is rotated, while pressing etched wafer 52 to abrasive cloth 54, whereby the surface of etched wafer 52 is mirror-polished.

Embodiment 12

This embodiment relates to still further method of manufacturing the semiconductor substrate having a gettering effect shown in FIG. 3.

Figure 7:
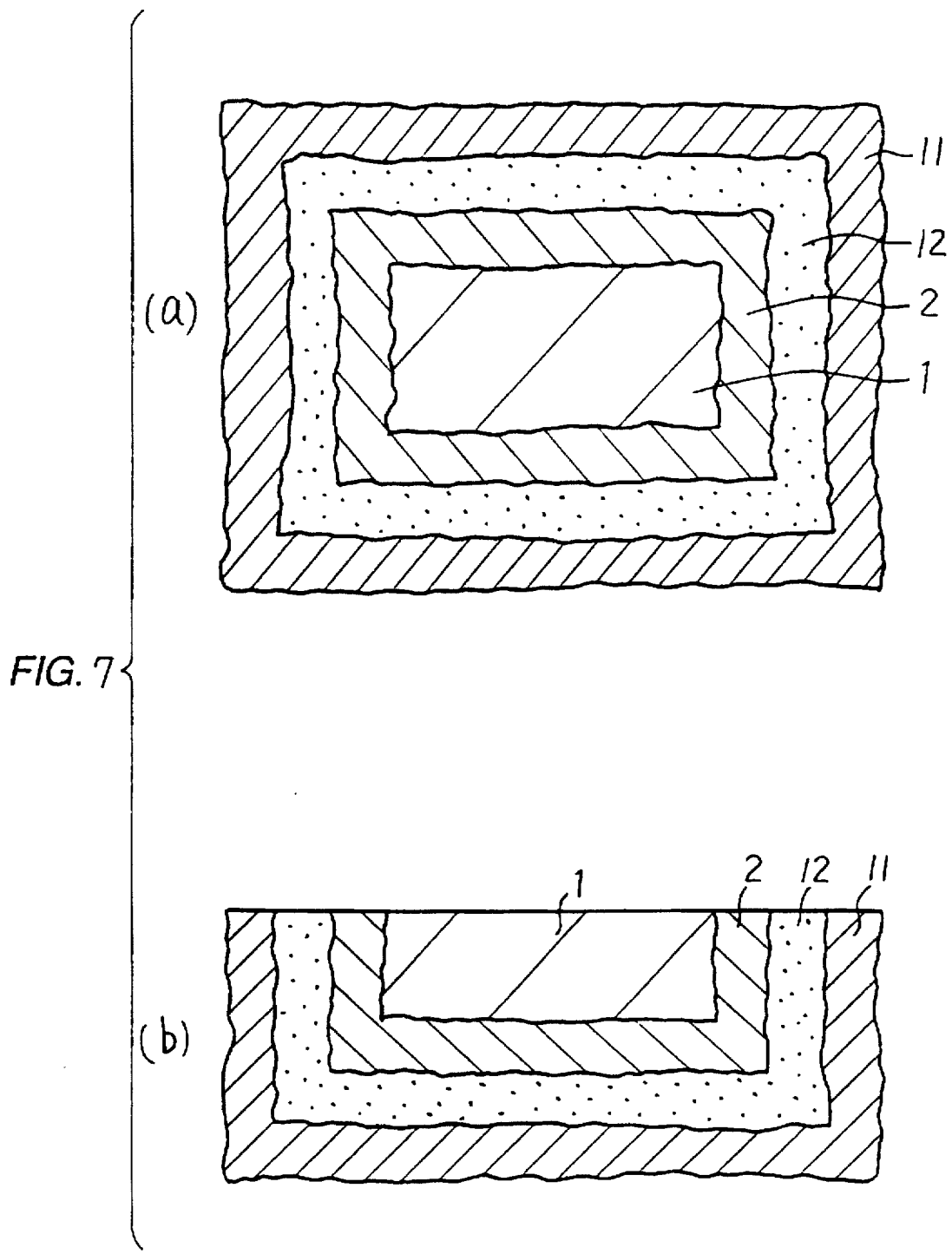
FIG. 7 shows cross sectional views of the semiconductor substrate in respective steps in sequence of a method of manufacturing the semiconductor substrate having a gettering effect shown in FIG. 3.

Referring to FIG. 7(a), polycrystalline silicon film 2 is formed on the surface of silicon single crystal wafer 1 having its surface etched. Silicon oxide film 12 is formed on the whole surface of polycrystalline silicon film 2 by a suitable method. Silicon nitride film 11 is formed on the whole surface of silicon oxide film 12 by a suitable method.

Referring to FIG. 7(b), mirror polish is performed so that the surface of silicon single crystal wafer 1 is exposed, whereby the semiconductor substrate having a gettering effect shown in FIG. 3 can be obtained.

Embodiment 13

This embodiment relates to still further method of manufacturing the semiconductor substrate having a gettering effect shown in FIG. 1.

Silicon single crystal wafer 1 on the sidewall and the rear surface of which polycrystalline silicon film 2 is formed is prepared. Silicon nitride film 11 is deposited over the whole surface of silicon single crystal wafer 1.

Figure 8:
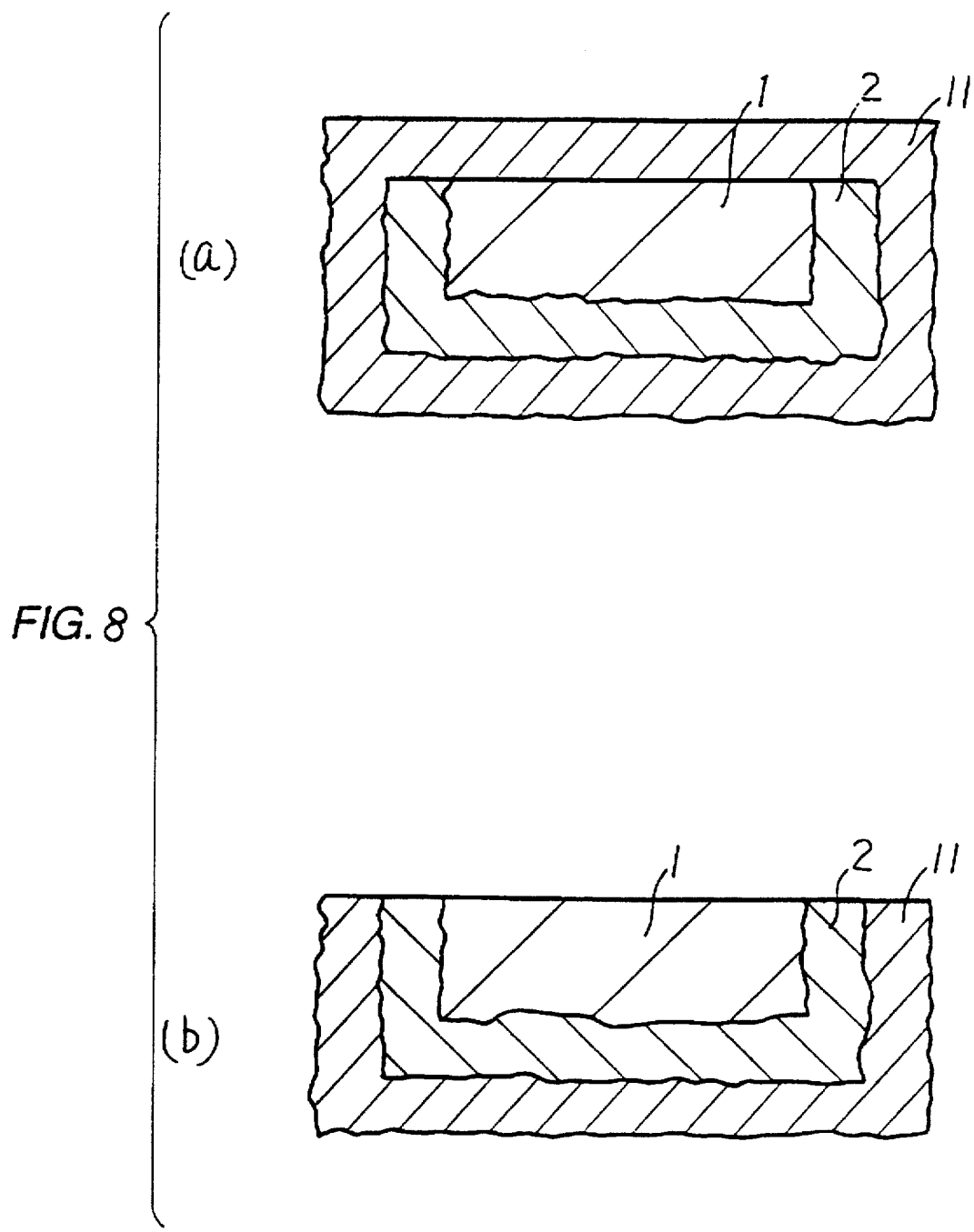
FIG. 8 shows cross sectional views of the semiconductor substrate in respective steps in sequence of another method of manufacturing the semiconductor substrate having a gettering effect shown in FIG. 1.

Referring to FIG. 8(b), silicon nitride film 11 is removed by etching, so that only the surface of silicon single crystal wafer 1 is exposed, whereby the semiconductor substrate having a gettering effect shown in FIG. 1 can be formed.

Embodiment 14

Figure 9:
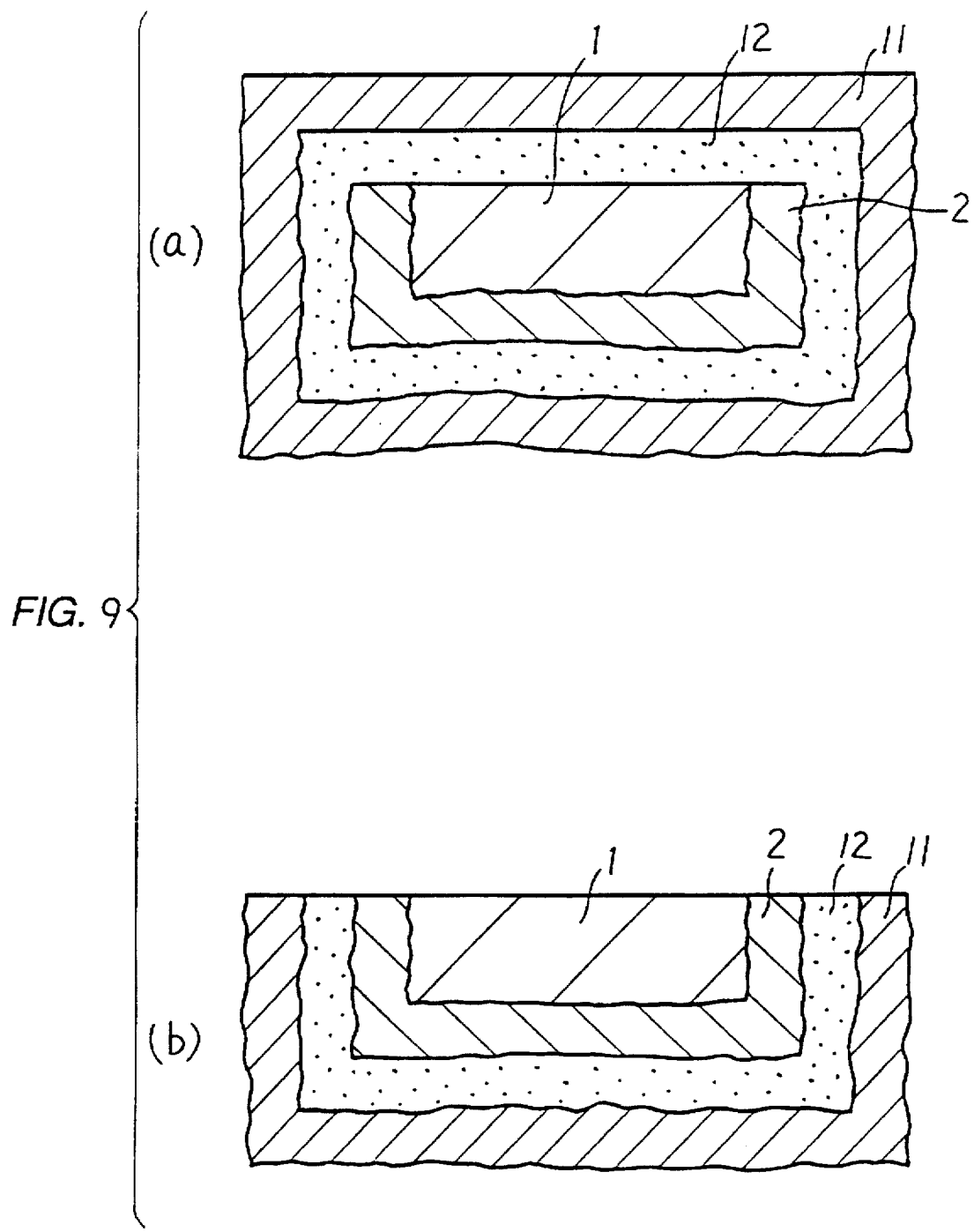
FIG. 9 shows cross sectional views of the semiconductor substrate in respective steps in sequence of another method of manufacturing the semiconductor substrate having a gettering effect shown in FIG. 3.
Figure 10:
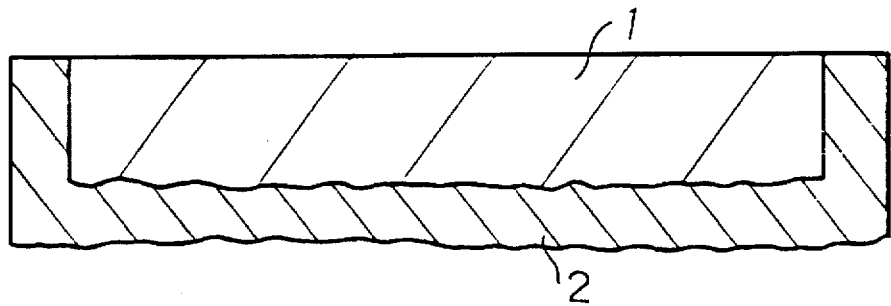
FIG. 10 is a cross sectional view of a conventional semiconductor substrate having a gettering effect.
Figure 11:
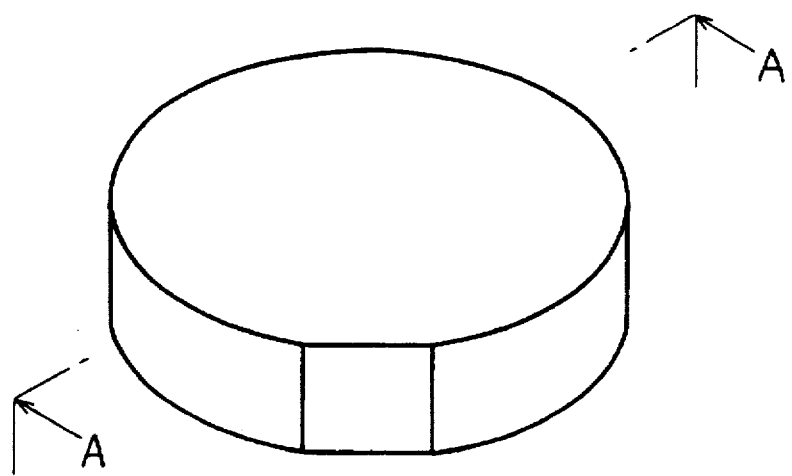
FIG. 11 is a perspective view of a silicon single crystal wafer.
Figure 12:
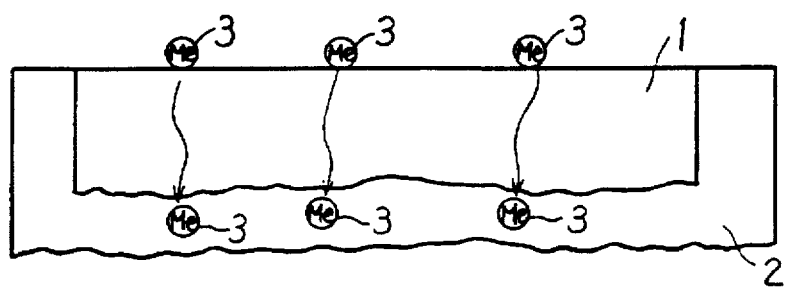
FIG. 12 is a schematic diagram showing a gettering effect.
Figure 13:
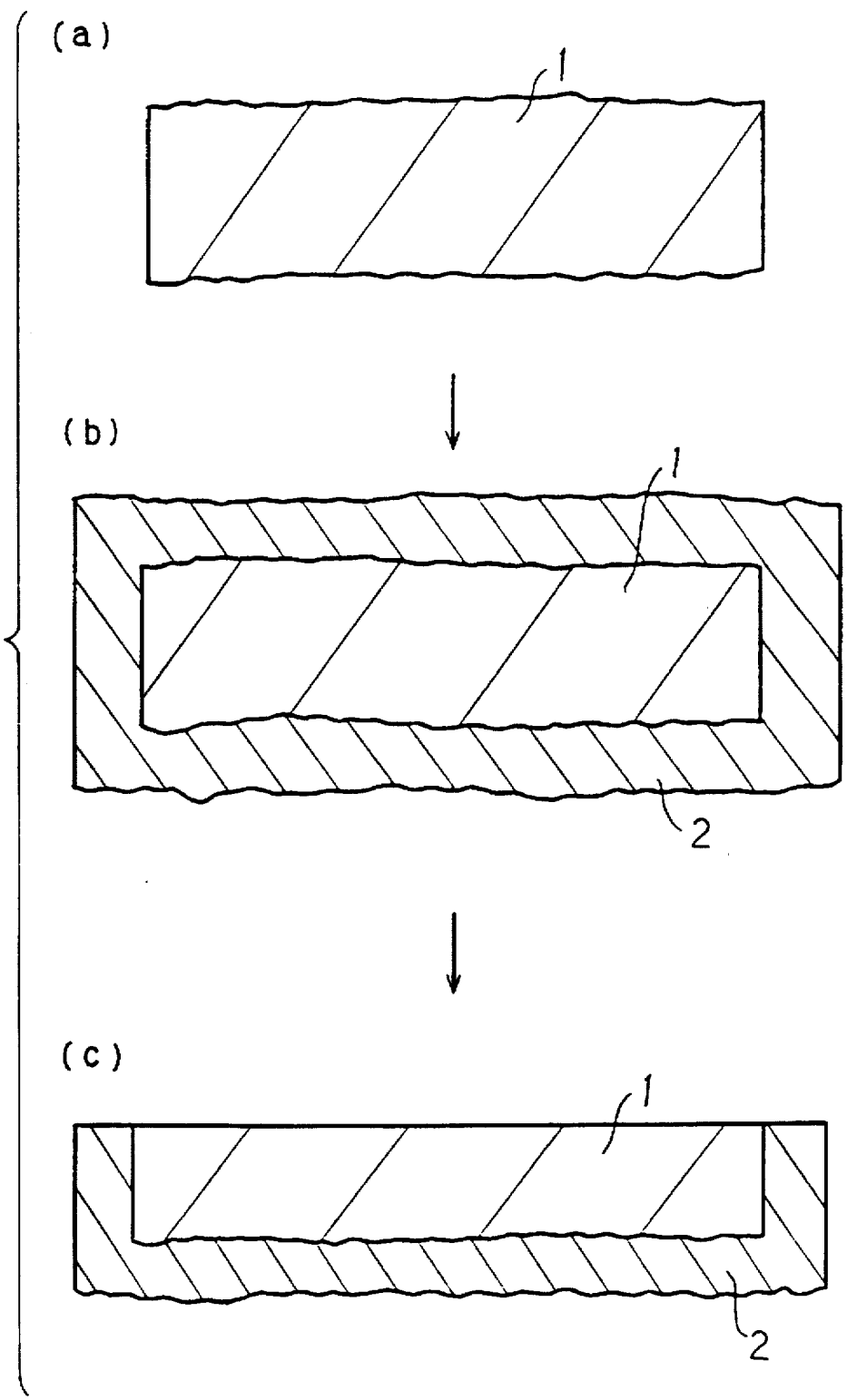
FIG. 13 shows cross sectional views of a semiconductor substrate in respective steps in sequence of a method of a conventional semiconductor substrate having a gettering effect.

This embodiment relates to still further method of manufacturing the semiconductor substrate having a gettering effect shown in FIG. 3. Referring to FIG. 9(a), silicon single crystal wafer 1 on the sidewall and the rear surface of which a polycrystalline silicon film is formed is prepared. Silicon oxide film 12 is formed over the whole surface of silicon single crystal wafer 1. Silicon nitride film 11 is formed on the whole surface of silicon oxide film 12. Silicon nitride film 11 and silicon oxide film 12 are removed so that only the surface of silicon single crystal wafer 1 is exposed, whereby the semiconductor substrate having a gettering effect shown in FIG. 3 can be obtained.

As described above, in the semiconductor substrate having a gettering effect according to the first aspect of the present invention, a silicon nitride film preventing transmission of oxygen is formed on the rear surface of the semiconductor substrate so as to cover a polycrystalline silicon film, whereby the polycrystalline silicon film does not contact with oxygen during the manufacturing process of the semiconductor device. Consequently, the semiconductor substrate maintaining a gettering effect for a long time period can be obtained.

In the semiconductor substrate having a gettering effect according to the second aspect of the present invention, a silicon oxide film is provided between a polycrystalline silicon film and a silicon nitride film. The thermal expansion coefficient of the silicon oxide film is between those of the silicon nitride film and the polycrystalline silicon film.

Accordingly, the silicon oxide film serves as a buffering film, preventing the silicon nitride film from peeling off the polycrystalline silicon film due to the difference between their thermal expansion coefficients. As a result, the semiconductor substrate maintaining a gettering effect for a long time can be obtained.

In the method of manufacturing a semiconductor substrate having a gettering effect according to the third aspect of the present invention, a silicon nitride film serving as an oxygen transmission preventing layer is formed on the rear surface of the semiconductor substrate so as to cover a polycrystalline silicon film, whereby the semiconductor substrate in which the polycrystalline silicon film does not contact with oxygen can be obtained.

In the method of manufacturing a semiconductor substrate having a gettering effect according to the fourth aspect of the present invention, a silicon oxide film is formed between a polycrystalline silicon film and a silicon nitride film. The thermal expansion coefficient of the silicon oxide film is between those of the silicon nitride film and the polycrystalline silicon film. Therefore, the silicon oxide film serves as a buffering film, preventing the silicon nitride film from peeling off the polycrystalline silicon film due to the difference of their thermal expansion coefficients. Consequently, the semiconductor substrate improved so as to maintain a gettering effect for a long time can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor substrate having a gettering effect, comprising:

a semiconductor substrate having a front surface and a rear surface;

a polycrystalline silicon film formed on the rear surface of said semiconductor substrate;

a silicon oxide film formed over the rear surface of said semiconductor substrate so as to cover said polycrystalline silicon film; and a silicon nitride film formed over the rear surface of said semiconductor substrate so as to cover said silicon oxide film, wherein the film thickness of said polycrystalline film is not less than 0.2 μm, the film thickness of said silicon oxide film is approximately 100 Å and the film thickness of said silicon nitride film is approximately 300 Å.

2. A method of manufacturing a semiconductor substrate having a gettering effect, comprising the steps of:

preparing a semiconductor substrate having a front surface and a rear surface;

forming a polycrystalline silicon film 0.2 μm or thicker in thickness on the rear surface of said semiconductor substrate;

forming a silicon oxide film about 100 Å in thickness on said polycrystalline silicon film; and forming a silicon nitride film about 300 Å in thickness on said silicon oxide film.

3. The method of manufacturing a semiconductor substrate according to claim 2, wherein said silicon oxide film is formed by chemical vapor deposition, and said silicon nitride film is formed by chemical vapor deposition.

* * * * *